(12) United States Patent
Pickett et al.

(10) Patent No.: US 11,043,618 B2
(45) Date of Patent: Jun. 22, 2021

(54) DISPLAY DEVICES COMPRISING GREEN-EMITTING QUANTUM DOTS AND RED KSF PHOSPHOR

(71) Applicant: Nanoco Technologies Ltd., Manchester (GB)

(72) Inventors: Nigel L. Pickett, Manchester (GB); Nathalie C. Gresty, Chester (GB); James Harris, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 16/290,450

(22) Filed: Mar. 1, 2019

(65) Prior Publication Data

US 2019/0198730 A1    Jun. 27, 2019

Related U.S. Application Data

(62) Division of application No. 15/337,557, filed on Oct. 28, 2016, now abandoned.

(Continued)

(51) Int. Cl.
  *H01L 33/50* (2010.01)
  *F21V 8/00* (2006.01)
(Continued)

(52) U.S. Cl.
  CPC .......... *H01L 33/507* (2013.01); *C09K 11/02* (2013.01); *C09K 11/617* (2013.01); *C09K 11/70* (2013.01); *G02B 6/005* (2013.01); *G02B 6/0073* (2013.01); *G02F 1/133621* (2013.01); *H01L 33/486* (2013.01); *H01L 33/504* (2013.01); *H01L 33/56* (2013.01); *G02F 2001/133614* (2013.01);
(Continued)

(58) Field of Classification Search
None
See application file for complete search history.

(56) References Cited

U.S. PATENT DOCUMENTS

| 7,323,696 B2 | 1/2008 | Vann et al. |
| 7,453,195 B2 | 11/2008 | Radkov |

(Continued)

FOREIGN PATENT DOCUMENTS

| WO | 2007002234 A1 | 1/2007 |
| WO | 2011036446 A1 | 3/2011 |

(Continued)

OTHER PUBLICATIONS

J. Hartolve, et al., Bringing Betters Pixels to UHD with Quantum Dots, Quantum Dots Forum, Mar. 18, 2015.

(Continued)

*Primary Examiner* — Nicholas J Tobergte
*Assistant Examiner* — Kien C Ly
(74) *Attorney, Agent, or Firm* — Blank Rome, LLP

(57) ABSTRACT

LED devices emitting white light comprise a blue-emitting LED, green-emitting quantum dots (QDs) and red-emitting $K_2SiF_6$:$Mn^{4+}$ (KSF) phosphor. A backlight unit (BLU) for a liquid crystal display (LCD) comprises one or more blue-emitting LEDs and a polymer film containing green-emitting QDs and KSF phosphor. The QDs and/or KSF phosphor may be encapsulated in beads that provide protection from oxygen and/or moisture.

18 Claims, 17 Drawing Sheets

Related U.S. Application Data

(60) Provisional application No. 62/249,595, filed on Nov. 2, 2015.

(51) Int. Cl.

| | |
|---|---|
| *G02F 1/1335* | (2006.01) |
| *C09K 11/70* | (2006.01) |
| *H01L 33/48* | (2010.01) |
| *C09K 11/02* | (2006.01) |
| *H01L 33/56* | (2010.01) |
| *C09K 11/61* | (2006.01) |
| *G02F 1/13357* | (2006.01) |
| *H05B 33/14* | (2006.01) |

(52) U.S. Cl.
CPC ...... *H01L 2933/0041* (2013.01); *H05B 33/14* (2013.01); *Y02B 20/00* (2013.01)

(56) References Cited

U.S. PATENT DOCUMENTS

| | | | |
|---|---|---|---|
| 7,495,383 B2 | 2/2009 | Chua et al. | |
| 7,497,973 B2 | 3/2009 | Radkov et al. | |
| 7,544,725 B2 | 6/2009 | Pickett et al. | |
| 7,648,649 B2 | 1/2010 | Radkov et al. | |
| 7,750,359 B2 | 7/2010 | Narendran et al. | |
| 8,847,197 B2 | 9/2014 | Pickett et al. | |
| 8,859,442 B2 | 10/2014 | Naasani et al. | |
| 8,957,401 B2 | 2/2015 | Pickett et al. | |
| 9,140,415 B2 | 9/2015 | Van Bommel et al. | |
| 9,142,732 B2 | 9/2015 | Luo et al. | |
| 9,406,849 B2 | 8/2016 | Bechtel et al. | |
| 9,564,557 B2 | 2/2017 | Weiler et al. | |
| 10,312,418 B2 | 6/2019 | Naasani et al. | |
| 2005/0208543 A1 | 9/2005 | Vann et al. | |
| 2006/0019098 A1 | 1/2006 | Chan et al. | |
| 2006/0255711 A1 | 11/2006 | Dejima et al. | |
| 2007/0024175 A1 | 2/2007 | Chua et al. | |
| 2008/0121844 A1 | 5/2008 | Jang et al. | |
| 2010/0142189 A1 | 6/2010 | Hong et al. | |
| 2011/0068321 A1 | 3/2011 | Pickett et al. | |
| 2013/0075692 A1 | 3/2013 | Naasani et al. | |
| 2013/0105839 A1 | 5/2013 | Naasani et al. | |
| 2014/0021503 A1* | 1/2014 | Yoshida | H01L 33/641 257/98 |
| 2014/0022779 A1 | 1/2014 | Su et al. | |
| 2014/0264172 A1 | 9/2014 | Daniels et al. | |
| 2014/0264192 A1 | 9/2014 | Gresty et al. | |
| 2014/0264196 A1 | 9/2014 | Werner et al. | |
| 2015/0021642 A1* | 1/2015 | Nakabayashi | H01L 24/97 257/98 |
| 2015/0047765 A1 | 2/2015 | Vo et al. | |
| 2015/0162506 A1 | 6/2015 | Lee et al. | |
| 2015/0221843 A1 | 8/2015 | Choi et al. | |
| 2015/0255690 A1 | 9/2015 | Vo et al. | |
| 2015/0275078 A1 | 10/2015 | Vo et al. | |
| 2016/0027971 A1* | 1/2016 | Anc | C09D 5/24 257/98 |
| 2016/0049560 A1 | 2/2016 | Oh et al. | |
| 2016/0087164 A1 | 3/2016 | Kawano et al. | |
| 2016/0097495 A1* | 4/2016 | Yamamoto | C09K 11/665 349/65 |

FOREIGN PATENT DOCUMENTS

| | | |
|---|---|---|
| WO | 2012085780 A1 | 6/2012 |
| WO | 2014064537 A2 | 5/2014 |
| WO | 2014177943 A2 | 11/2014 |

OTHER PUBLICATIONS

P. Pust, et al., A Revolution in Lighting, Nat. Mater., 2015, 14, pp. 454-458.

F. Zhang, et al., ACS Nano, 2015, 9, pp. 4533-4542.

Hirosaki, Naoto et al., Characterization and properties of green-emitting β-SiAlON : Eu2+ powder phosphors for white light-emitting diodes; Applied Physics Letters, May 2005, 86, 211905; https:www.researchgate.net/publication/234960080.

Pickett, Nigel L et al; "Heavy Metal-Free Quantum Dots for Display Applications"; Society for Information Display 2015 International Symposium Digest of Technical Papers; Jun. 2015; vol. 46; No. 1; pp. 168-169.

* cited by examiner

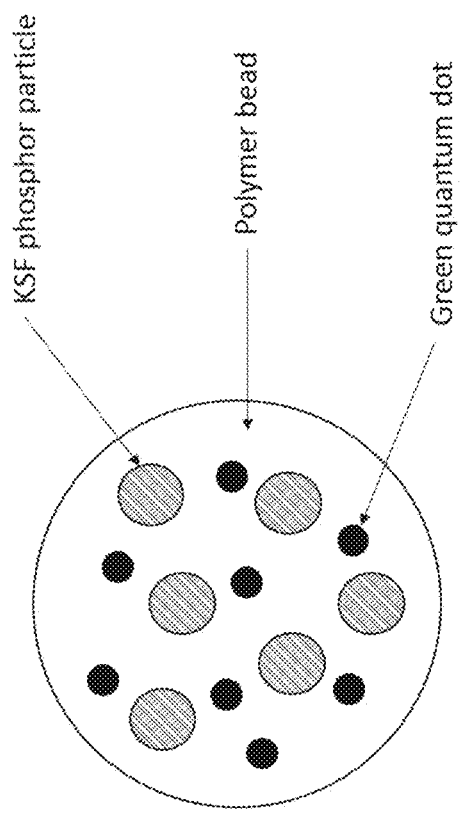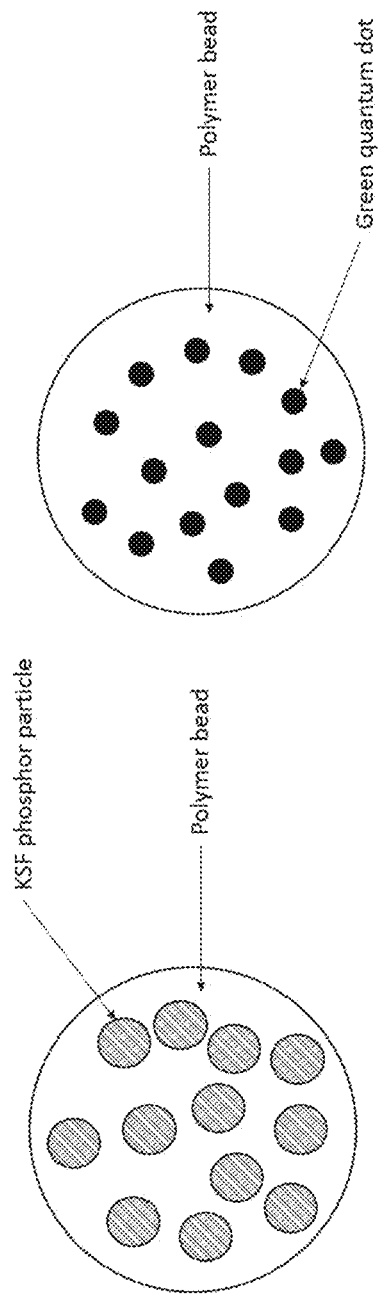
FIG. 1
FIG. 2

DISPLAY DEVICES COMPRISING GREEN-EMITTING QUANTUM DOTS AND RED KSF PHOSPHOR

CROSS-REFERENCE TO RELATED APPLICATIONS

This application is a division of U.S. application Ser. No. 15/337,557 filed on Oct. 28, 2016, which claims the benefit of U.S. Provisional Application No. 62/249,595 filed on Nov. 2, 2015, the contents of which are hereby incorporated by reference in their entireties.

STATEMENT REGARDING FEDERALLY SPONSORED RESEARCH OR DEVELOPMENT

Not Applicable

BACKGROUND OF THE INVENTION

1. Field of the Invention

The present invention relates to materials and processes for the production of display devices. More specifically, the invention relates to backlight units for display devices comprising quantum dots and $K_2SiF_6:Mn^{4+}$ (KSF) phosphor.

2. Description of the Related Art Including Information Disclosed Under 37 CFR 1.97 and 1.98

Quantum dots (QDs) have been used in the backlight unit (BLU) of liquid crystal displays (LCDs) to improve the color gamut compared to conventional LCD backlight units comprising a blue LED and a conventional rare earth phosphor. The color gamut is compared to standards in the Commission Internationale de l'Eclairage (CIE) 1931 color space. Such standards include the National Television System Committee 1953 (NTSC 1953) and the Digital Cinema Initiatives-P3 (DCI-P3) color triangles. In 2012, the International Telecommunications Union recommended a new standard for ultra-high definition television (UHDTV), known as Rec. 2020. The color triangle for Rec. 2020 is significantly larger than the NTSC 1953 and DCI-P3 color triangles, covering 76% of the color space seen by the human eye.

QDs have been used to produce BLUs with good overlap with the NTSC 1953 and DCI-P3 color space. However, achieving good overlap with Rec. 2020 is a challenge, in part owing to the full-width at half-maximum (FWHM) of the spectral emission peaks of the QDs.

A recent presentation suggested that, to achieve greater than 90% overlap with the Rec. 2020 color space, green QDs emitting at 526 nm with a FWHM of 30 nm and red-emitting QDs emitting at 640 nm with a FWHM of 30 nm would be required. [J. Hartolve, J. Chen, S. Kan, E. Lee and S. Gensler, *Bringing Better Pixels to UHD with Quantum Dots*. Presented at Quantum Dots Forum, 18 Mar. 2015, San Francisco] FWHM values in this region may be achieved using cadmium-based QDs, such as CdSe. However, in the EU, the Restriction of the Use of Certain Hazardous Substances (RoHS) Directive limits the amount of cadmium (and other heavy-metals) that may be used in electrical and electronic equipment. Similar legislation is being adopted throughout the world. Thus, there is a need to develop display devices comprising heavy-metal-free QDs, i.e. QDs without the incorporation of toxic elements such as Pb, Hg or Cd, such as Group III-V-based QDs, which are compliant with RoHS and other health and safety legislation. Such heavy-metal-free QDs may include Group III-V-based materials (such as InP), as well as alloys of e.g. Group III-V materials alloyed with other elements, e.g. InPZnS (as described in U.S. Publication No. 2014/0264172). In Group III-V-based materials, the quantum confinement effects are stronger than those in Group III-V materials (including CdSe). This leads to a larger change in emission wavelength from a given change in particle size, and consequently a broader FWHM is displayed by Group III-V materials than Group II-V materials. FWHM values are typically broader for red-emitting heavy-metal-free QDs than green-emitting heavy-metal-free QDs.

One potential means for providing a broad color gamut is to combine green-emitting QDs with a narrowband-emitting red phosphor, such as $K_2SiF_6:Mn^{4+}$ (KSF). KSF has four emission maxima at 613 nm, 631 nm, 636 nm and 648 nm, each with a FWHM<5 nm. [P. Pust, P. J. Schmidt and W. Schnick, Nat. Mater., 2015, 14, 454] Zhang et al. recently reported a white LED comprising a blue GaN LED, green-emitting $CH_3NH_3PbX_3$ (X=Br, I, Cl) QDs and a red-emitting KSF phosphor. [F. Zhang, H. Zhong, C. Chen, X. G. Wu, X. Hu, H. Huang, J. Han, B. Zhou and Y. Dong, ACS Nano, 2015, 9, 4533] The device covered ~130% of the NTSC color space, with 96% overlap. To form the LED device, KSF powder was blended with silicone gel and left to cure for minutes. $CH_3NH_3PbBr_3$ QDs were dissolved in chloroform with polymethylmethacrylate. The layer of silicone gel with KSF was painted onto the surface of a blue GaN LED chip, followed by casting a layer of QDs in PMMA. Though the study demonstrates that a large color gamut may be achieved by combining green QDs with a red KSF phosphor, the $CH_3NH_3PbX_3$ QDs are not currently commercially available and contain lead, another heavy-metal subject to RoHS regulations. Further, the on-chip configuration may create thermal stability issues due to the close proximity of the QDs to the LED chip, resulting in short device lifetimes.

Manganese-activated fluoride complex phosphors are phosphors having $Mn^{4+}$ as an activator and a fluoride complex salt of an alkali metal, an amine, or an alkaline earth metal as a base crystal. The coordination center in the fluoride complex that forms the base crystal is a trivalent metal (B, Al, Ga, In, Y, Sc or a lanthanoid), a tetravalent metal (Si, Ge, Sn, Ti, Zr, Re, Hf), or a pentavalent metal (V, P, Nb or Ta) with 5 to 7 fluorine atoms coordinated around the coordination center.

A preferred $Mn^{4+}$-activated fluoride complex phosphor is $A_2MF_6:Mn$ having a hexafluoro complex salt of an alkali metal as a base crystal (where A is selected from the group consisting of Li, Na, K, Rb, Cs and $NH_4$, and M is selected from the group consisting of Ge, Si, Sn, Ti and Zr). Particularly preferred is a $Mn^{4+}$-activated fluoride complex phosphor where A is K (potassium) or Na (sodium), and M is Si (silicon) or Ti (titanium)—for example, $K_2SiF_6:Mn^{4+}$ (KSF).

There is a need in the art to provide a means to integrate heavy-metal-free QDs and KSF phosphor into display devices, whereby the optical stability of the QDs is maintained.

BRIEF SUMMARY OF THE INVENTION

Herein, a method is disclosed for combining a blue-emitting LED, green-emitting QDs, and red-emitting KSF phosphor to produce white light with a wide color gamut, in such a way that the optical properties of the QDs are not deteriorated by exposure to heat. LED devices comprising a blue-emitting LED chip, green-emitting QDs and red-emitting KSF phosphor are also disclosed.

In some embodiments, the QDs and/or the KSF phosphor are incorporated into polymer beads. In some embodiments, the QDs and the KSF phosphor are incorporated into the same bead. In alternative embodiments, the QDs and the KSF phosphor are incorporated into separate beads. In other embodiments, the QDs and the KSF phosphor are incorporated into a "core/shell bead" having a central core comprising a first material surrounded by a shell comprising a second material. The KSF phosphor may be incorporated into the core of the bead and QDs into the shell of the bead. Alternatively, the QDs may be incorporated into the core of the bead and KSF phosphor into the shell of the bead.

In some embodiments, the QDs and/or the KSF phosphor are deposited into the cup portion of an LED package.

In some embodiments, the QDs and/or the KSF phosphor are incorporated into a film that is positioned remotely from the LED chip.

BRIEF DESCRIPTION OF THE SEVERAL VIEWS OF THE DRAWING(S)

FIG. 1 is a cross-sectional view of a polymer bead comprising green quantum dots and KSF phosphor particles.

FIG. 2 is a cross-sectional view of two polymer beads; one bead containing KSF phosphor and the other bead containing green quantum dots.

DETAILED DESCRIPTION OF THE INVENTION

A blue-emitting LED may be combined with green-emitting QDs, and red-emitting KSF phosphor to produce white light with a wide color gamut in such a way that the optical properties of the QDs are not adversely affected by exposure to heat.

In a simulation, a combination of green-emitting quantum dots with KSF phosphor was shown to provide similar color performance relative to both the DCI and Rec. 2020 standards as compared to a combination of green-emitting and red-emitting quantum dots. However, the combination of green-emitting quantum dots and KSF phosphor was photometrically brighter. The simulation data is shown in Table 1.

TABLE 1

| Green PL, nm | Green FWHM, nm | Red PL, nm | Red FWHM, nm | Lum | DCI Coverage CIE 1931 | DCI Coverage CIE1976 | Rec2020 Coverage CIE 1931 | Rec2020 Coverage CIE1976 |
|---|---|---|---|---|---|---|---|---|
| 536 | 42 | KSF | | 11.30 | 90.9% | 96.2% | 70.5% | 78.8% |
| 536 | 38 | KSF | | 11.33 | 91.2% | 96.2% | 71.4% | 79.7% |
| 536 | 42 | 640 | 60 | 9.08 | 90.9% | 96.0% | 68.7% | 77.5% |
| 536 | 38 | 640 | 60 | 9.07 | 91.2% | 96.1% | 69.6% | 78.3% |
| 536 | 38 | 635 | 55 | 9.64 | 91.3% | 96.1% | 69.2% | 77.5% |
| 536 | 38 | 645 | 55 | 8.44 | 91.2% | 96.1% | 71.6% | 81.1% |

Figure 13:
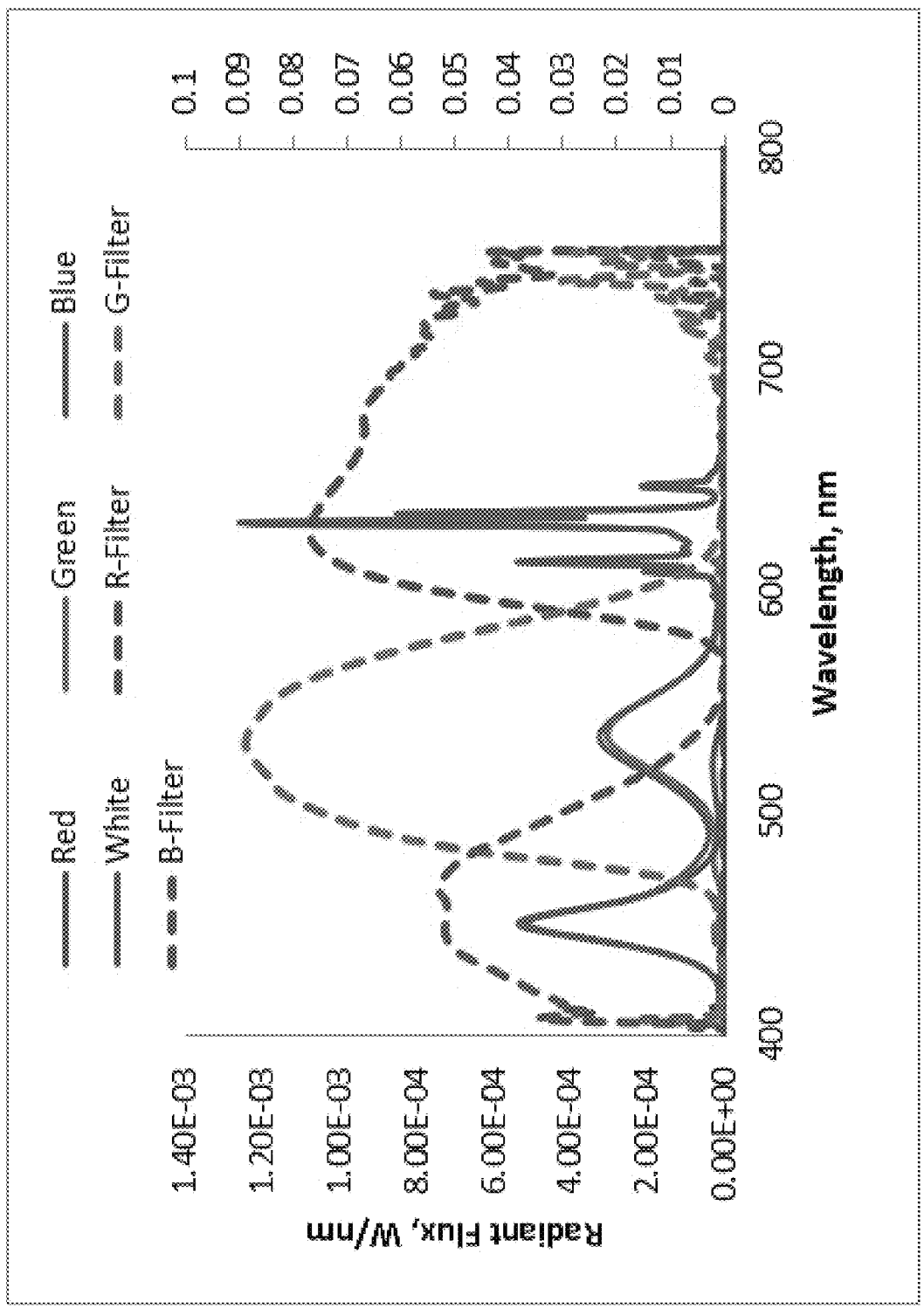
FIG. 13 is a simulated spectrum of a film containing green-emitting quantum dots and KSF phosphor.
Figure 14:
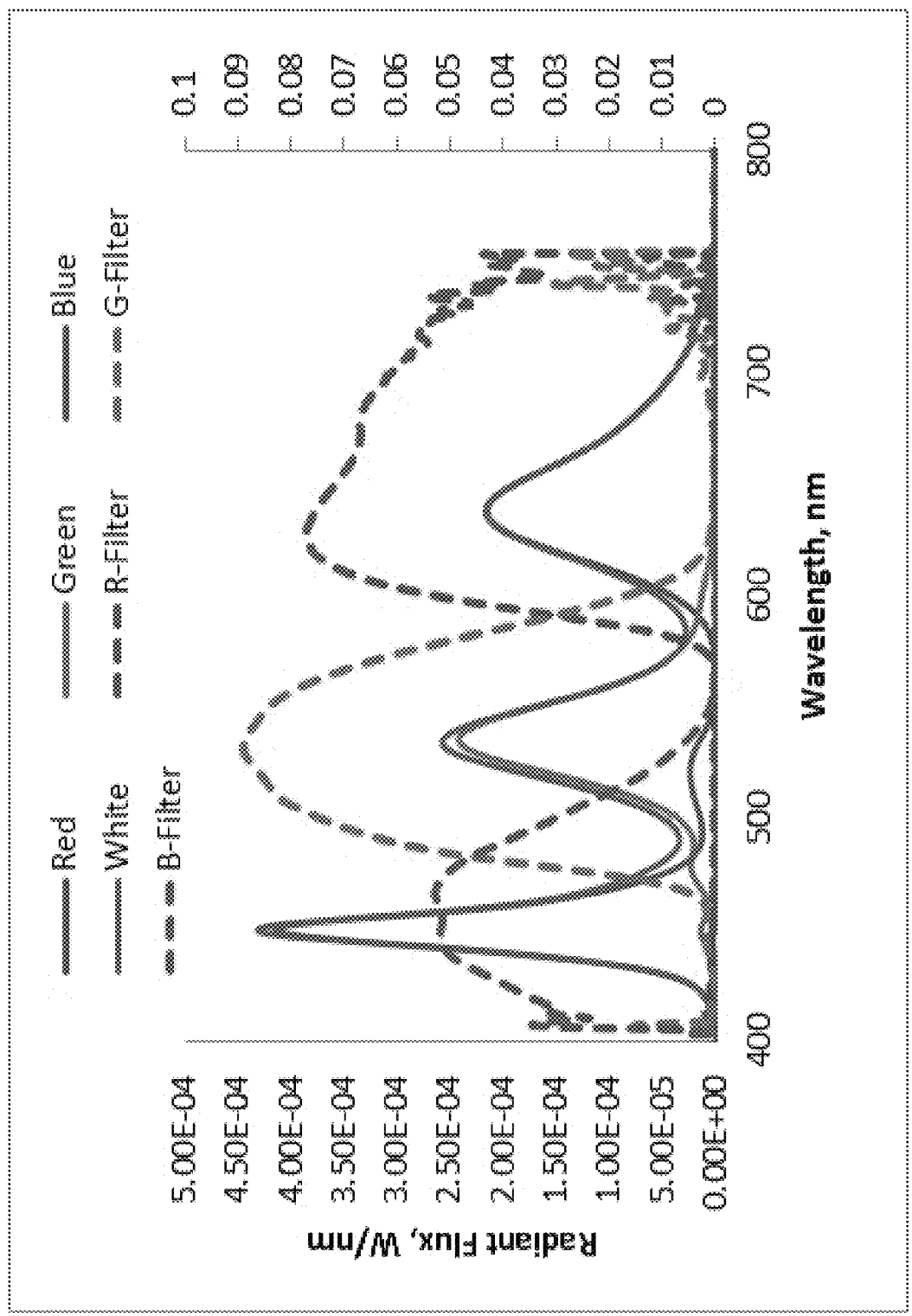
FIG. 14 is a simulated spectrum of a film containing green-emitting quantum dots and red-emitting quantum dots.
Figure 15:
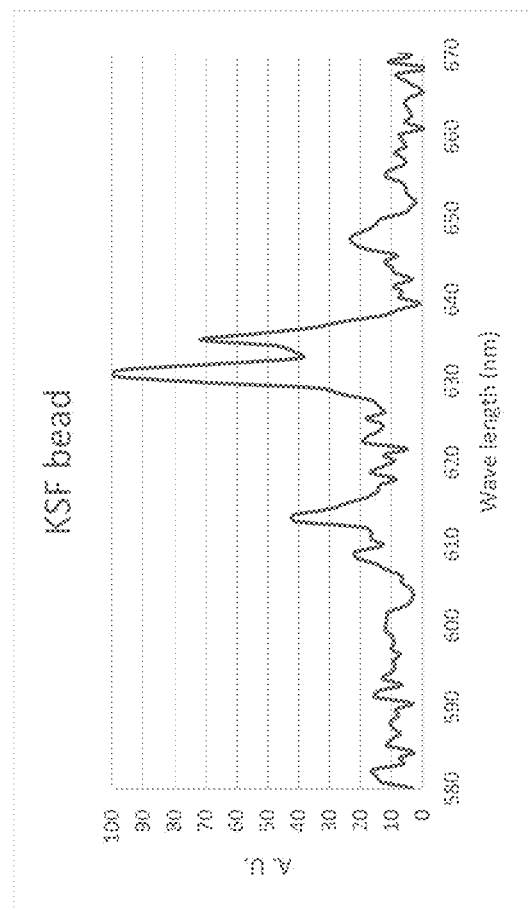
FIG. 15 is a normalized emission spectrum of polymer beads containing KSF phosphor.
Figure 16:
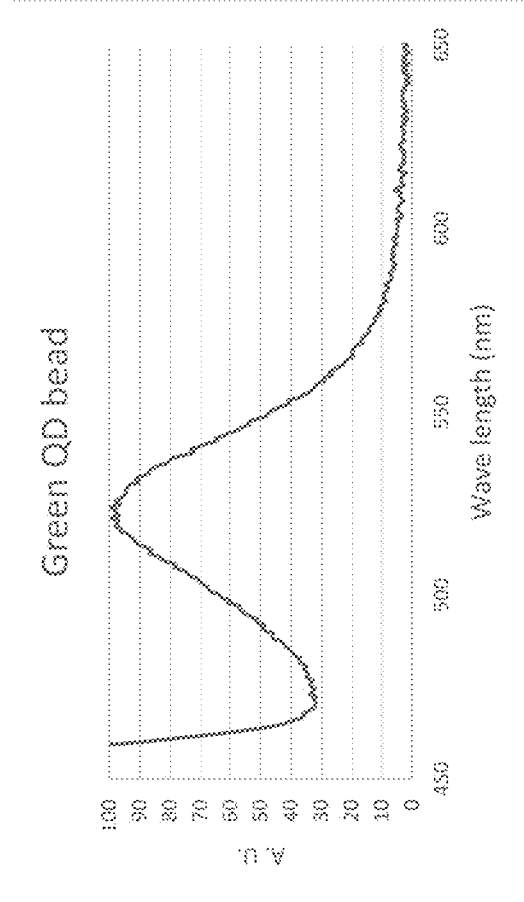
FIG. 16 is a normalized emission spectrum of polymer beads containing green-emitting quantum dots.
Figure 17:
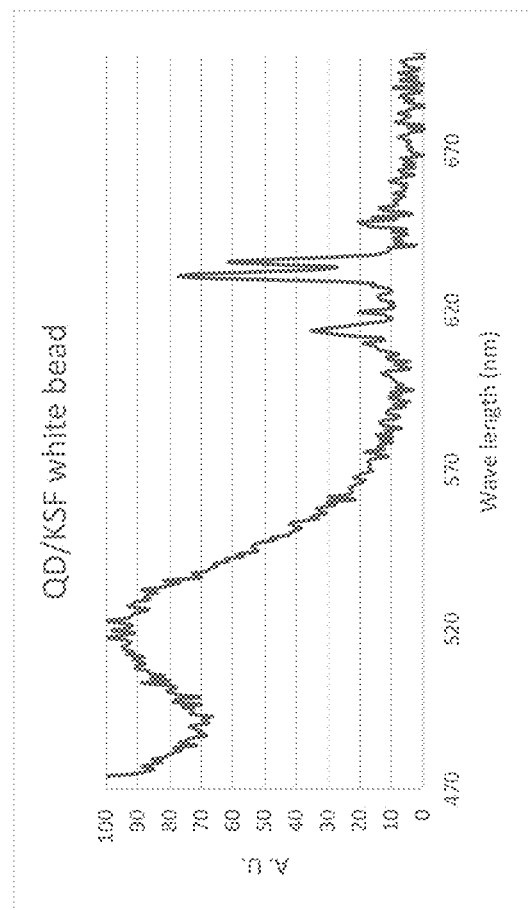
FIG. 17 is a normalized emission spectrum of beads containing both green-emitting quantum dots and KSF phosphor.

A simulated spectrum of a film containing green-emitting quantum dots and KSF phosphor [excited with blue light?] is shown in FIG. 13 and a simulated spectrum of a film containing green-emitting quantum dots and red-emitting quantum dots is shown in FIG. 14. Also shown in FIGS. 13 and 14 are the transmission spectra of the red, green, and blue color filters used in a typical LCD television set.

In certain embodiments, the QDs and/or the KSF phosphor are incorporated into polymer beads. The incorporation of QDs into polymer beads is described in U.S. Pat. No. 7,544,725 "Labelled Beads;" U.S. Pat. No. 8,859,442 "Encapsulated Nanoparticles;" U.S. Pat. No. 8,847,197 "Semiconductor Nanoparticle-Based Materials;" and U.S.

Pat. No. 8,957,401 "Semiconductor Nanoparticle-Based Materials;" and in published patent applications: U.S. Pub. No. 2014/0264192 "Preparation of Quantum Dot Beads Having a Silyl Surface Shell" and U.S. Pub. No. 2014/0264196 "Multi-Layer-Coated Quantum Dot Beads," the disclosures of which are hereby incorporated by reference in their entireties. Similar techniques may be used to incorporated phosphor particles into polymer beads. The incorporation of phosphor particles, such as KSF phosphor particles, is described in U.S. Pat. No. 7,323,696 "Phosphor Particle Coded Beads."

In some embodiments, green-emitting QDs and red-emitting KSF phosphor may be incorporated into the same bead, as illustrated in FIG. 1. Incorporating the QDs and the KSF phosphor into the same bead may be advantageous for ease of processing.

In alternative embodiments, green-emitting QDs and red-emitting KSF phosphor may be incorporated into separate beads, as illustrated in FIG. 2. Incorporating the QDs and the KSF phosphor into separate beads can offer an effective means of color mixing, since suitable ratios of green- and red-emitting beads may be combined to produce a desired white point in the CIE 1931 color space.

Figure 3:
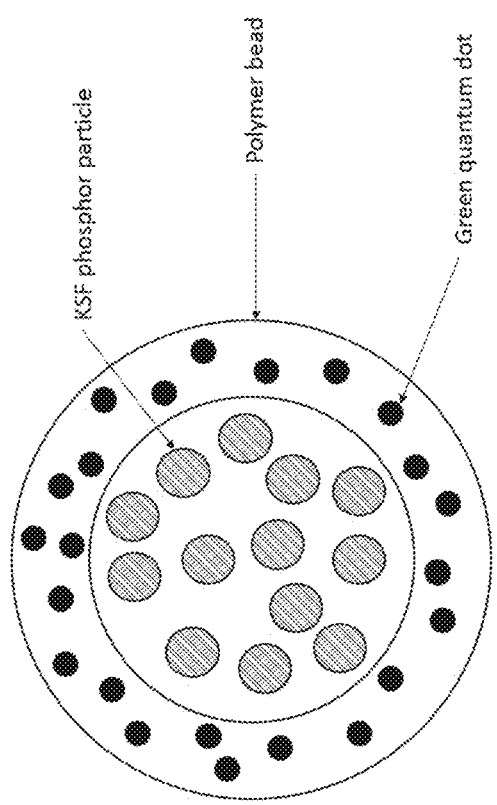
FIG. 3 is a cross-sectional view of a core/shell polymer bead comprising a core comprising KSF phosphor particles and a shell comprising green quantum dots.
Figure 4:
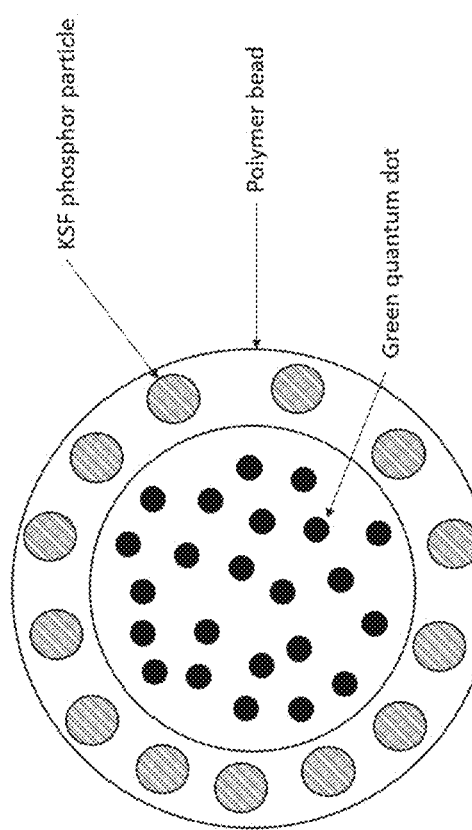
FIG. 4 is a cross-sectional view of a core/shell polymer bead comprising a core comprising green quantum dots and a shell comprising KSF phosphor particles.

In yet other embodiments, green-emitting QDs and red-emitting KSF phosphor may be incorporated into a core/shell bead—i.e., a bead having a central core comprising a first material surrounded by a shell comprising a second material. KSF phosphor may be incorporated into the core of the bead and green-emitting QDs into the shell of the bead, as shown in FIG. 3, or green-emitting QDs may be incorporated into the core of the bead and KSF phosphor into the shell of the bead, as shown in FIG. 4.

In some embodiments, the QDs and/or the KSF phosphor are deposited into the cup portion of an LED package. Techniques to deposit QDs and phosphor particles into LED cups are known in the art and can include combining the particles with an optically-transparent resin, depositing the resin in an LED cup, and allowing the resin to cure. For example, the incorporation of QDs into an acrylate resin and subsequent deposition into LED cups is described in U.S. Pub. No. 2013/0105839 "Acrylate Resin for QD-LED" the disclosure of which is hereby incorporated by reference in its entirety. Examples of suitable resins include, but are not restricted to, acrylates, silicones and epoxies.

In some embodiments, the QDs and/or the KSF phosphor are incorporated into a film that is positioned remotely from the LED chip. This is particularly advantageous for separating the QDs from the LED chip, which prevents thermal degradation of the QDs due to heat emitted by the LED. Techniques to incorporate QDs into a resin matrix are known in the prior art, for example, as disclosed in U.S. Patent Pub. No. 2015/0047765 "Quantum Dot Films Utilizing Multi-Phase Resins;" U.S. Patent Pub. No. 2015/0275078 "Quantum Dot Compositions;" and U.S. Patent Pub. No. 2015/0255690 "Methods for Fabricating High Quality Quantum Dot Polymer Films." Similar techniques may be used to incorporate KSF phosphor particles into resin matrices.

In some embodiments, the QDs and/or the KSF phosphor are first incorporated into polymer beads, which are subsequently incorporated into a polymer film. The formation of a polymer film incorporating QD beads is described in U.S. Patent Pub. No. 2013/0075692 "Semiconductor Nanoparticle-Based Light-Emitting Materials which is hereby incorporated by reference in its entirety.

In alternative embodiments, the QDs and/or the KSF phosphor are incorporated directly into a polymer or resin matrix and processed into a film.

Figure 5:
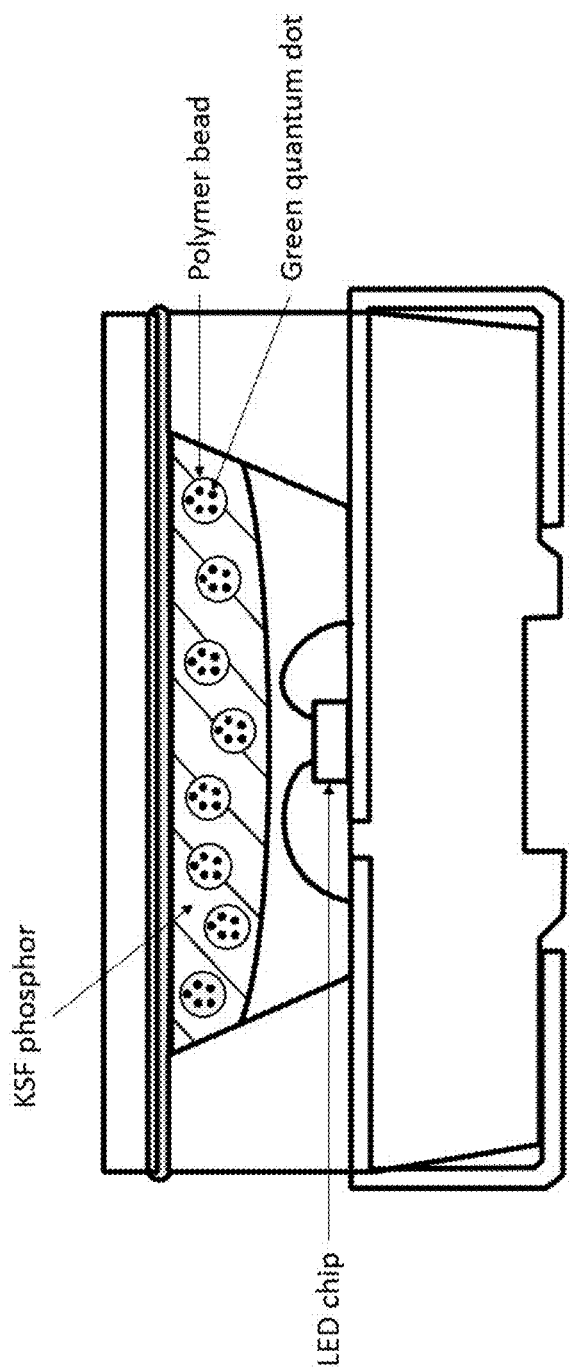
FIG. 5 is a cross-sectional view of an LED comprising an LED chip and an LED cup filled with KSF phosphor and green quantum dot polymer beads.

In one particular embodiment, illustrated in FIG. 5, a white-emitting LED comprises a blue LED chip and an LED cup filled with KSF phosphor and green-emitting quantum dot polymer beads. By incorporating the QDs into beads, the QDs are protected from thermal degradation resulting from heat generated by the LED chip.

Figure 6:
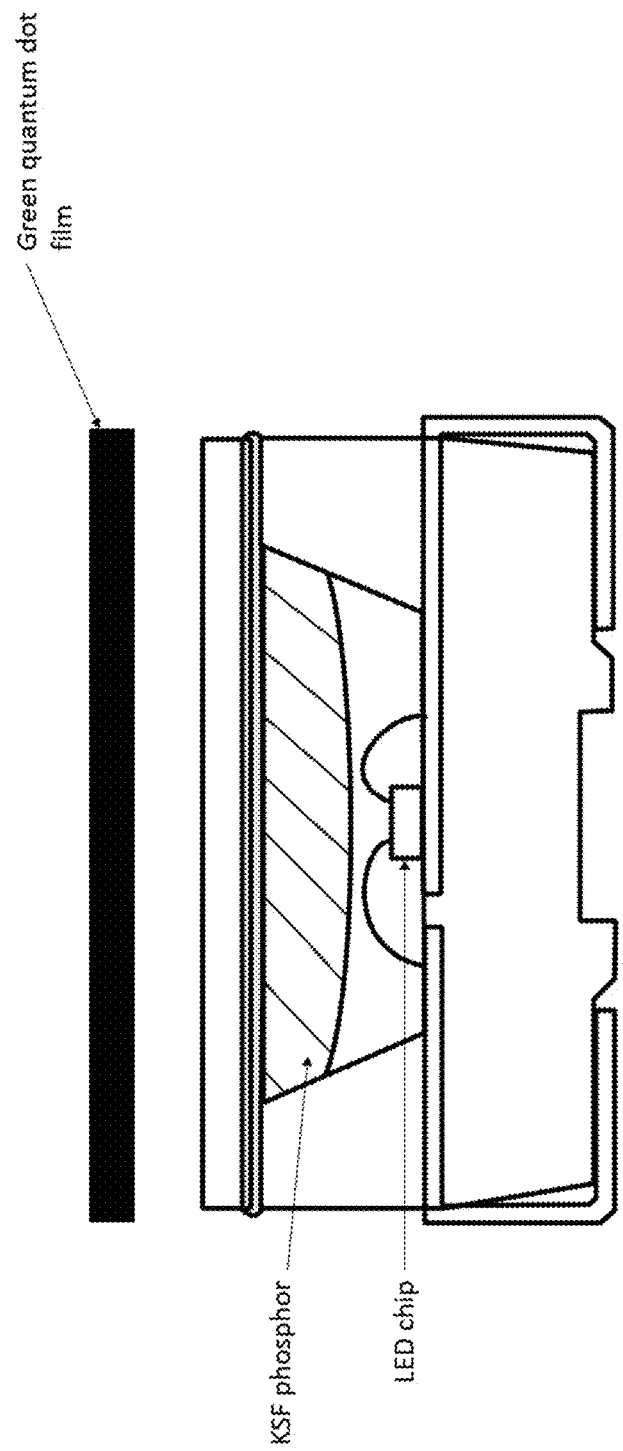
FIG. 6 is a cross-sectional view of an LED comprising an LED chip and an LED cup filled with KSF phosphor, and a remote film comprising green quantum dots.

In another embodiment, as shown in FIG. 6, a white-emitting LED comprises a blue-emitting LED chip, an LED cup filled with red-emitting KSF phosphor, and a remote polymer film comprising green-emitting QDs. The remote location of the QD film, such that it is not in direct contact with the LED chip, protects the QDs from thermal degradation by the LED.

Figure 7:
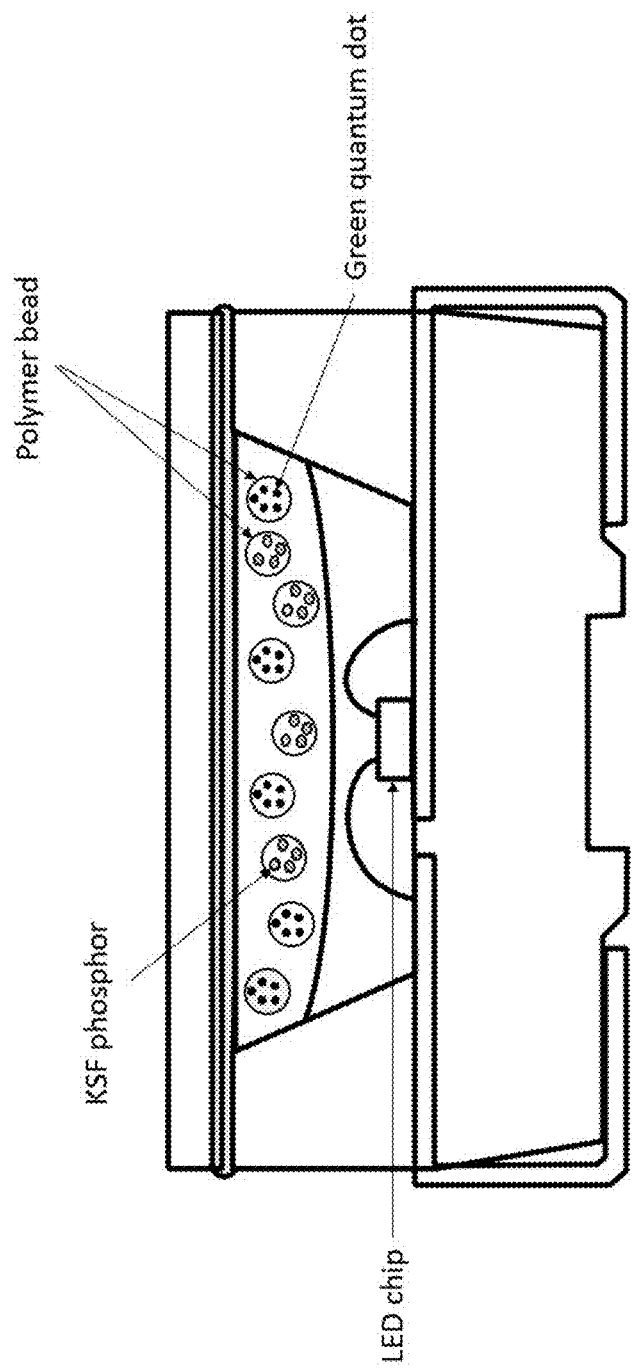
FIG. 7 is a cross-sectional view of an LED comprising an LED chip and an LED cup filled with KSF phosphor polymer beads and green quantum dot polymer beads.

In a further embodiment, as shown in FIG. 7, a white-emitting LED comprises a blue-emitting LED chip and an LED cup filled with red-emitting KSF phosphor polymer beads and green-emitting QD polymer beads.

Figure 8:
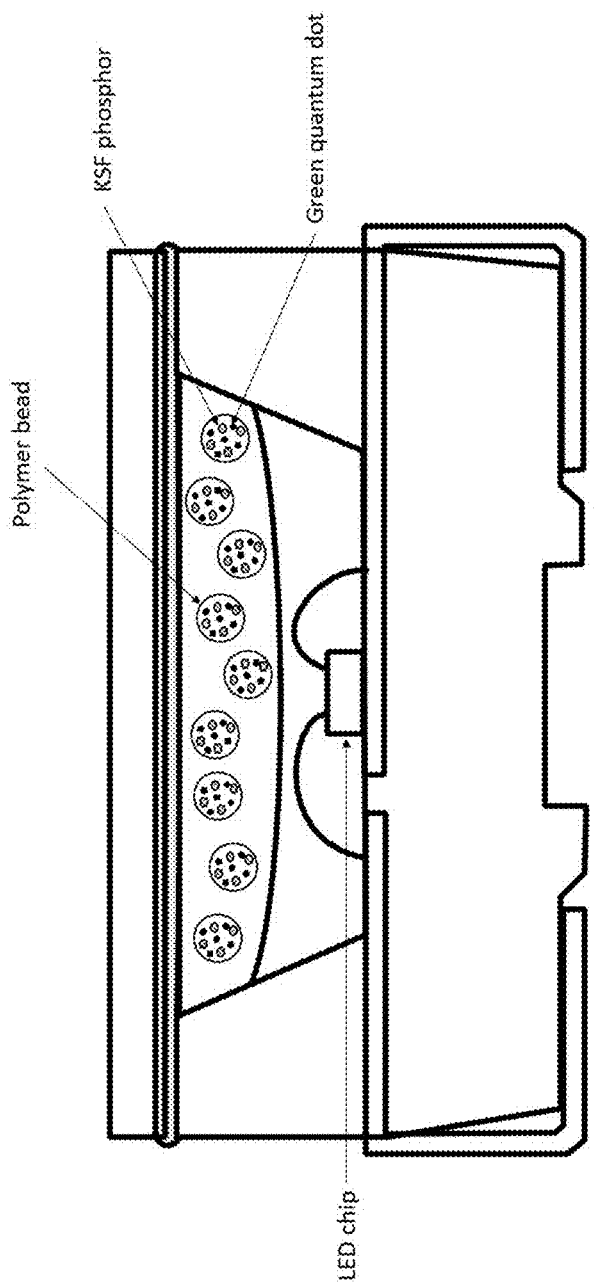
FIG. 8 is a cross-sectional view of an LED comprising an LED chip and an LED cup filled with polymer beads comprising KSF phosphor and green quantum dots.

In a further embodiment, illustrated in FIG. 8, a white-emitting LED comprises a blue-emitting LED chip and an LED cup filled with polymer beads comprising red-emitting KSF phosphor and green-emitting QDs. The KSF phosphor and QDs may be randomly distributed throughout the beads, as illustrated in FIG. 1, or may be formed into core/shell beads, as shown in FIGS. 3 and 4.

Figure 9:
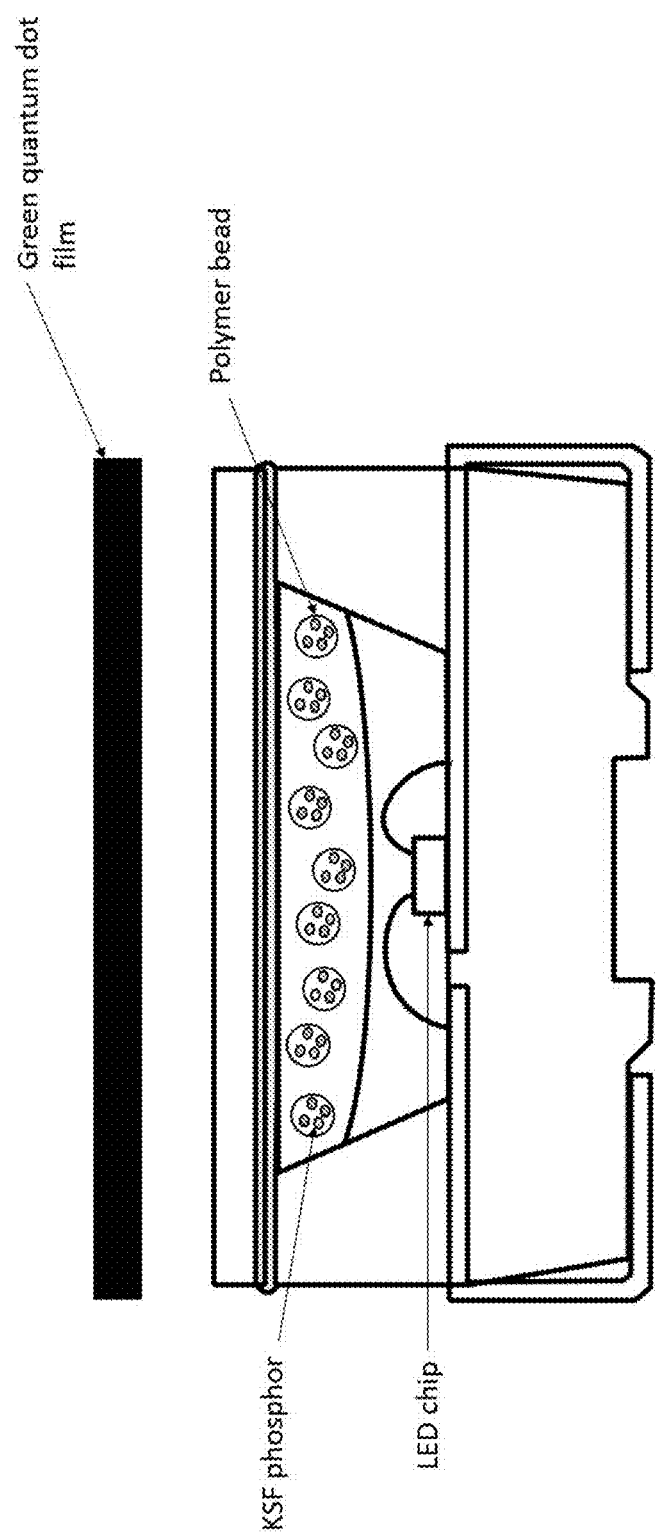
FIG. 9 is a cross-sectional view of an LED comprising an LED chip and an LED cup filled with polymer beads comprising KSF phosphor, and a remote film comprising green quantum dots.

In another embodiment, as shown in FIG. 9, a white-emitting LED comprises a blue-emitting LED chip, an LED cup filled with polymer beads comprising red-emitting KSF phosphor, and a "remote film" comprising green-emitting quantum dots—i.e., a film physically separated from the LED package.

Figure 10:
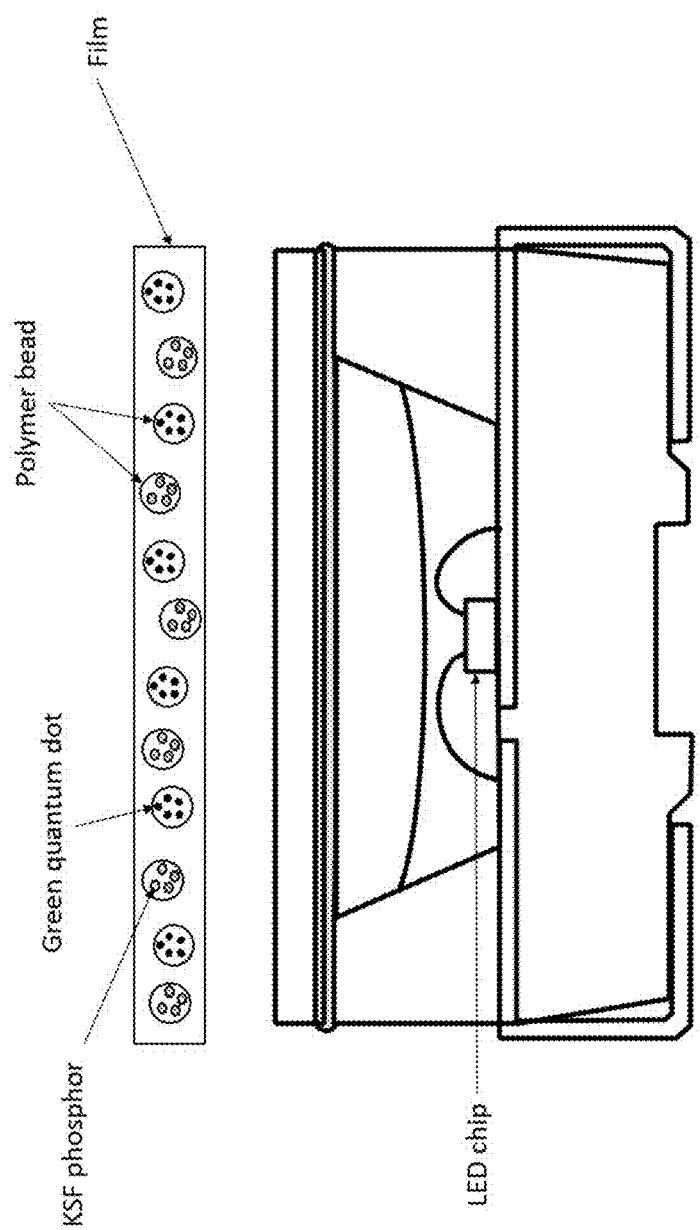
FIG. 10 is a cross-sectional view of an LED and a remote film comprising polymer beads comprising KSF phosphor and polymer beads comprising green quantum dots.

In a further embodiment, as shown in FIG. 10, a white-emitting LED comprises a blue-emitting LED chip, and a remote polymer film comprising red-emitting KSF phosphor contained in polymer beads and polymer beads comprising green-emitting QDs.

Figure 11:
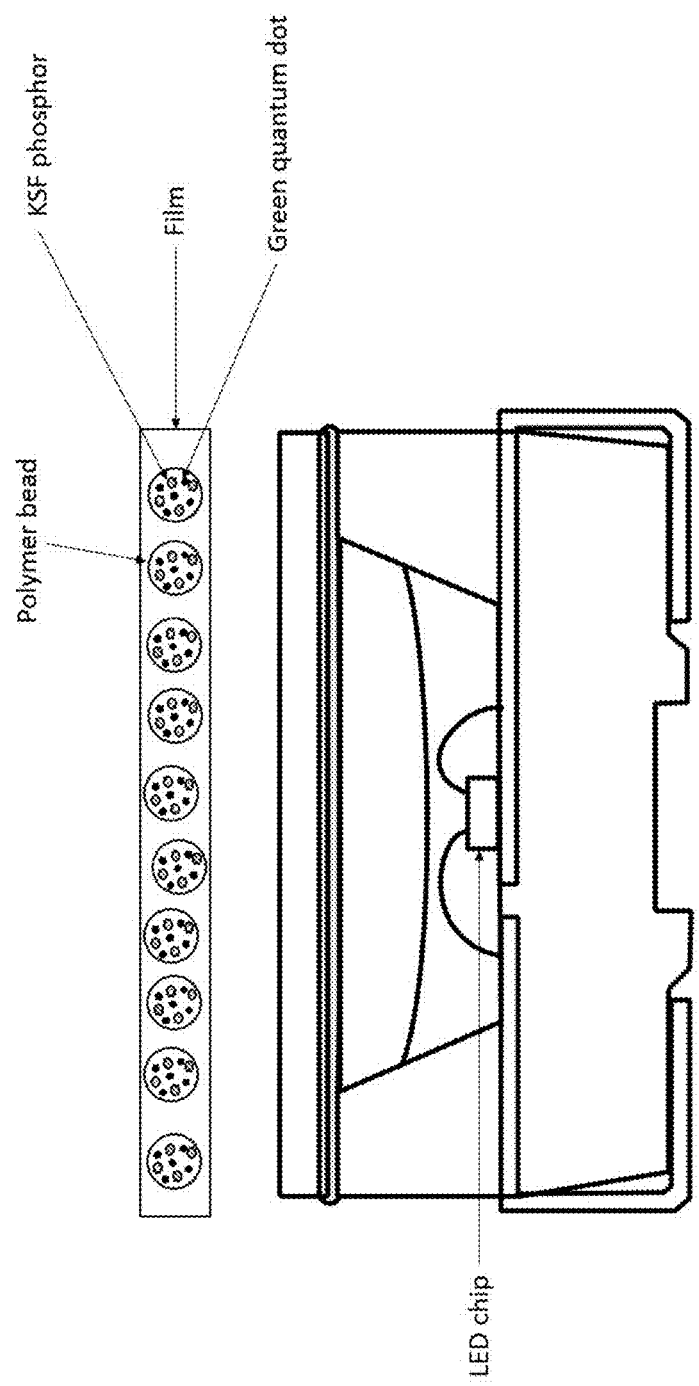
FIG. 11 is a cross-sectional view of an LED and a remote film comprising polymer beads comprising KSF phosphor and green quantum dots.

In a further embodiment, illustrated in FIG. 11, a white-emitting LED comprises a blue-emitting LED chip, and a remote polymer film comprising polymer beads comprising red-emitting KSF phosphor and green-emitting QDs. The KSF phosphor and QDs may be randomly distributed throughout the beads, as shown in FIG. 1, or may be formed into core/shell beads, as shown in FIGS. 3 and 4.

Figure 12:
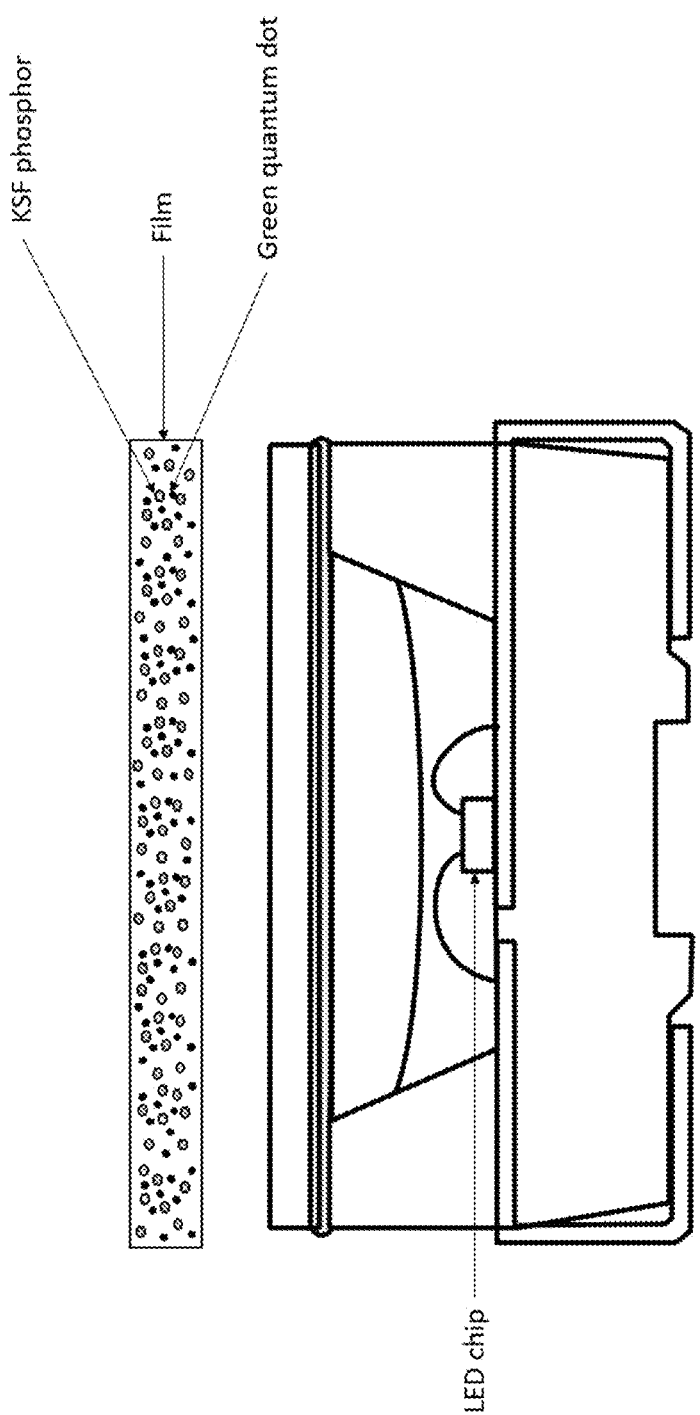
FIG. 12 is a cross-sectional view of an LED and a remote film comprising KSF phosphor particles and green quantum dots.

In a further embodiment, as shown in FIG. 12, a white-emitting LED comprises a blue-emitting LED chip, and a remote polymer film comprising red-emitting KSF phosphor particles and green-emitting QDs.

In alternative embodiments, another narrowband phosphor may be substituted for the KSF phosphor.

The invention has particular application in the backlight units used in liquid crystal displays. A liquid crystal display is an electronically modulated optical device made up of any number of segments controlling a layer of liquid crystals arrayed in front of a light source (backlight) or reflector to produce images in color or monochrome. A backlight is a form of illumination used in liquid crystal displays (LCDs). Because LCDs do not themselves produce light (unlike, for example, CRT displays and LED displays), they need an illumination source (ambient light or a special light source) to produce a visible image. Backlights may illuminate the LCD from the side or back of the display panel.

Figure 18:
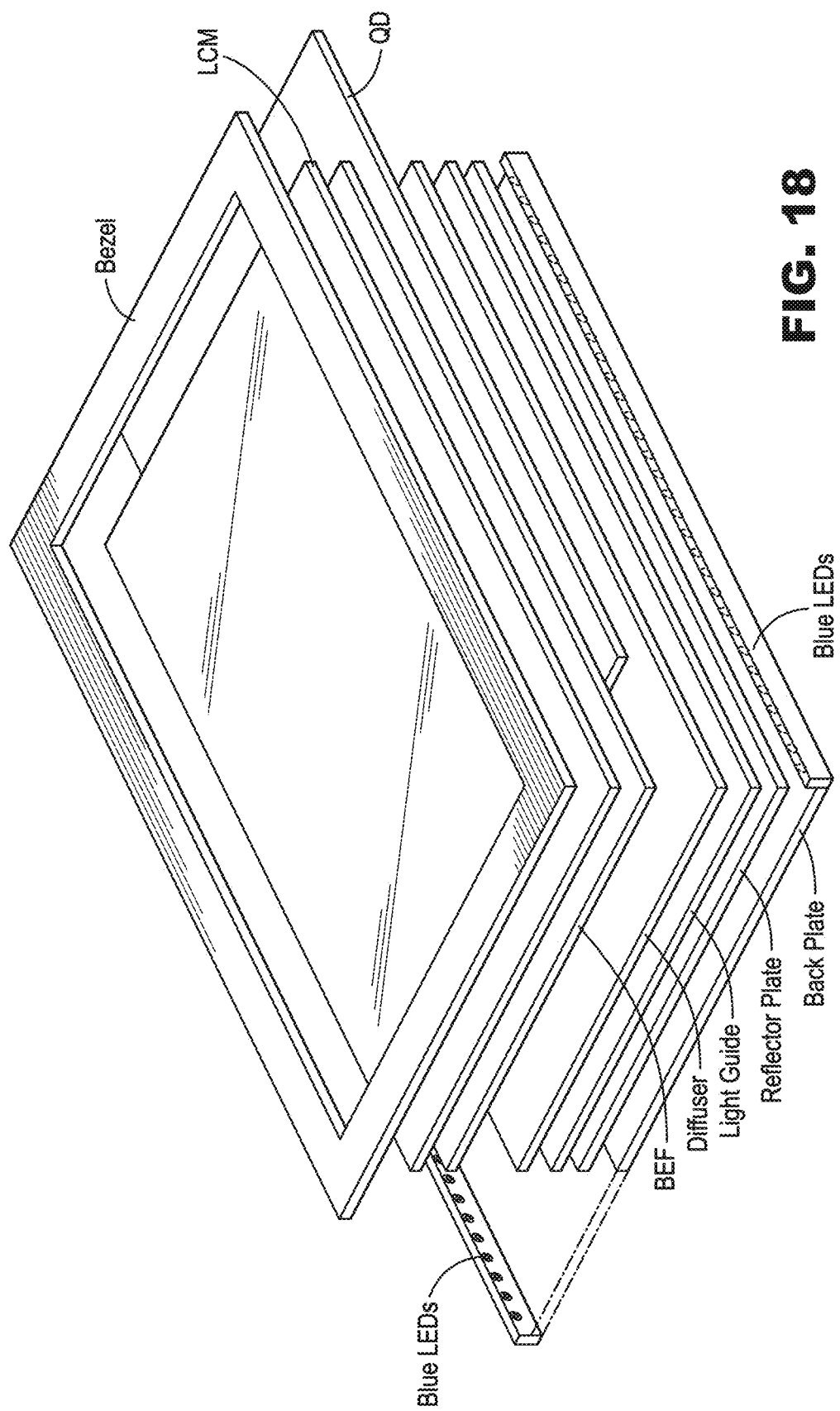
FIG. 18 is an exploded view of a liquid crystal display (LCD) equipped with a quantum dot backlight unit.

An exemplary QD-based backlight unit is shown in FIG. 18. The illustrated BLU includes a brightness enhancement film (BEF) and a liquid crystal matrix (LCM). The QD-containing layer is shown displaced laterally from its actual position in order to permit visualization of the LEDs. In an embodiment of the invention, the "QD" layer is a polymer film comprising green-emitting quantum dots and KSF phosphor. The quantum dots and/or the KSF phosphor may be contained within beads that provide protection from heat, oxygen and/or moisture.

EXAMPLES

Method for Making QD/Polymer- and KSF-Containing Beads

Preparation of Polyvinyl Alcohol (PVOH) Solution:

Aqueous PVOH solution was prepared by dissolving PVOH in distilled water and stirring overnight. For further dissolution of the undissolved PVOH part the whole solution was heated at 70° C. for 3-4 hr. For bead synthesis, the PVOH solution was filtered to remove any undissolved polyvinyl acetate and/or dust particles.

Standard Resin Preparation

General Procedure

First, the required amount of QD dot solution was transferred to a glass vial containing a stirring bar under an inert atmosphere. Toluene was removed from the QD dot solution using reduced pressure with continuous stirring. Once all traces of visible solvent were removed, the residue was heated to 40° C. for 45 minutes under vacuum to ensure that all traces of residual solvent were removed. The stock solution was prepared by adding degassed lauryl methacrylate (LMA) and the cross-linker trimethylolpropane trimethacrylate (TMPTM) to the degassed photoinitiator(s) and stirring in the dark to ensure complete dissolution of the photoinitiator(s). Then, the required amount of the stock solution was added to the dry QD residue under an inert atmosphere and in dark conditions. The entire resin solution was stirred overnight to ensure complete dispersion of the QDs.

Bead Synthesis

General Procedure

First, the required amount of TWEEN® 80 nonionic, sorbitan ester surfactant [CRODA AMERICAS LLC, WILMINGTON DELAWARE 19801] was added to the reaction vessel followed by the required amount of PVOH solution and stirred for at least 30 minutes for complete dissolution of the surfactant into the PVOH solution. The whole solution mixture was degassed for a few hours by applying a vacuum/nitrogen cycle. After completion of the degassing procedure, the reaction vessel was placed inside a rig equipped with a four UV-LED head. Then, the required amount of QD resin solution was injected into the PVOH/surfactant solution under constant stirring. After a certain stirring time, the bead polymerization was started by activating the UV light source for several minutes (depending on the reaction conditions). After the polymerization, the beads were washed twice with cold distilled water then once with a water/acetonitrile (50/50 volume ratio) mixture then twice with only acetonitrile. Usually, the beads were washed in a centrifuge machine. After washing, the beads were dried under vacuum for several hours or overnight.

A typical bead synthesis was carried out as follows:

KSF Beads

First, 0.4 g of TWEEN 80 surfactant was added to 10 mL of a 4% PVOH solution and stirred for 30 minutes for complete dissolution of the surfactant into the PVOH solution and degassed for a few hours by applying a vacuum/nitrogen cycle. For KSF resin preparation, first the required amount of KSF was degassed and then the required amount of degassed LMA/TMPTM (1:0.154 volume ratio with 1% IRGACURE® 819 photo-initiator [BASF SE COMPANY CARL-BOSCH-STR. 38 LUDWIGSHAFEN, GERMANY 67056]) resin was added from the LMA/TMPTM stock solution. The KSF resin solution was stirred overnight under an inert atmosphere and in dark conditions. The next day, 0.5 mL of the KSF resin solution was injected into 10 mL of degassed PVOH/surfactant solution under constant stirring at 800 rpm with a cross magnetic stirrer bar and under a nitrogen atmosphere. After 10 minutes of stirring, bead polymerization was started by activating the UV light source for 10 minutes. The resulting beads were washed by the method described above and dried under vacuum for several hours.

Green QD Beads

First, 0.4 gram of TWEEN 80 surfactant was added to 10 mL of a 4% PVOH solution and stirred for 30 minutes for complete dissolution of the surfactant into the PVOH solution and degassed for a few hours by applying a vacuum/nitrogen cycle. For green QD resin preparation, first a QD solution was dried under vacuum. Then, 3 grams of degassed LMA/TMPTM (1/0.154 volume ratio with 1% IRGACURE 819) resin was added from the LMA/TMPTM stock solution and stirred overnight under an inert atmosphere and in dark conditions. The whole QD resin solution was stirred overnight to ensure complete dispersion of the QDs. 0.5 mL of the QD resin solution was injected the next day into 10 mL of the degassed PVOH/surfactant solution under constant stirring at 800 rpm with a cross magnetic stirrer bar and under an $N_2$ atmosphere. After 10 minutes of stirring, bead polymerization was started by activating the UV light source for 10 minutes. The resulting beads were washed by the method described above and dried under vacuum for several hours.

QD/KSF White Beads

First, 0.4 g TWEEN 80 surfactant was added to 10 mL of a 4% PVOH solution and stirred for 30 minutes to obtain complete dissolution of the surfactant into the PVOH solution and degassed for a few hours by applying a vacuum/nitrogen cycle. For QD/KSF white bead synthesis, first KSF and green QD resin were prepared separately following the same procedure described above. Then, a quantity of KSF and green QD resin were mixed together for 2 hours to produce "white" KSF/QD beads—i.e., beads that provide white light when excited by and mixed with blue light.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. It is to be understood that this invention is not limited to the particular embodiments described herein and that various changes and modifications may be made without departing from the scope of the present invention as literally and equivalently covered by the following claims.

What is claimed is:

1. A light-emitting device comprising:
   a blue light emitting diode (LED);
   a plurality of $K_2SiF_6:Mn^{4+}$ (KSF) phosphor particles contained within a first polymer bead, the first polymer bead optically coupled to the blue LED; and
   a plurality of quantum dots optically coupled to the blue LED.

2. The light-emitting device recited in claim 1 wherein the plurality of quantum dots are contained within a second polymer bead.

3. The light-emitting device recited in claim 1 wherein the plurality of quantum dots and the plurality of KSF phosphor particles are contained within the first polymer bead.

4. The light-emitting device recited in claim 3 wherein the first polymer bead comprises a polymer selected from the group consisting of acrylates, silicones, and epoxies.

5. The light-emitting device recited in claim 1 wherein the plurality of quantum dots are green-emitting quantum dots.

6. The light-emitting device recited in claim 5 wherein the light emitted by the device comprises a mixture of green light from the green-emitting quantum dots together with red light emitted by the KSF phosphor particles and blue light from the LED.

7. The light-emitting device recited in claim 1, wherein the light emitting device is a backlight unit for a liquid crystal display.

8. The light-emitting device recited in claim 1, wherein the plurality of quantum dots are heavy metal-free quantum dots.

9. The light emitting device of claim 1, wherein
the first polymer bead has a core comprising a first material and a shell surrounding the core and comprising a second material, and
the plurality of KSF phosphor particles are contained within the core of the first polymer bead.

10. The light emitting device of claim 1, wherein the plurality of quantum dots are contained within a shell of the first polymer bead.

11. The light emitting device of claim 1, wherein
the first polymer bead has a core comprising a first material and a shell surrounding the core and comprising a second material, and
the plurality of KSF phosphor particles are contained within the shell of the first polymer bead.

12. The light emitting device of claim 1, wherein the plurality of quantum dots are contained within a core of the first polymer bead.

13. The light emitting device of claim 1, wherein the plurality of KSF phosphor particles and the plurality of quantum dots are contained within the first polymer bead, the first polymer bead having a core comprising a first material and a shell surrounding the core and comprising a second material, and
wherein one of the plurality of KSF phosphor particles and the plurality of quantum dots are contained within the core of the bead and the other one of the plurality of KSF phosphor particles and the plurality of quantum dots are contained within the shell of the bead.

14. A bead comprising an optically-transparent resin and a plurality of KSF phosphor particles embedded in the resin.

15. The bead recited in claim 14 further comprising:
a plurality of quantum dots embedded in the resin.

16. A bead comprising a central core portion surrounded by a shell portion comprising an optically-transparent resin and a plurality of KSF phosphor particles embedded in the optically-transparent resin of the shell portion.

17. The bead recited in claim 16 further comprising a plurality of quantum dots in the core portion.

18. A bead comprising:
a central core portion comprising an optically-transparent resin having a plurality of KSF phosphor particles embedded therein; and
a shell portion surrounding the central core portion and comprising a plurality of quantum dots.

* * * * *